United States Patent
Li et al.

(10) Patent No.: US 10,749,029 B2
(45) Date of Patent: *Aug. 18, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kun-Mu Li, Hsinchu County (TW); Tsz-Mei Kwok, Hsinchu (TW); Ming-Hua Yu, Hsinchu (TW); Chan-Lon Yang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/226,276

(22) Filed: Dec. 19, 2018

(65) Prior Publication Data

US 2019/0123201 A1 Apr. 25, 2019

Related U.S. Application Data

(63) Continuation of application No. 14/833,022, filed on Aug. 21, 2015, now Pat. No. 10,164,096.

(51) Int. Cl.
*H01L 29/78* (2006.01)
*H01L 29/06* (2006.01)
(Continued)

(52) U.S. Cl.
CPC ...... *H01L 29/7848* (2013.01); *H01L 21/0228* (2013.01); *H01L 21/02112* (2013.01);
(Continued)

(58) Field of Classification Search
CPC .......... H01L 29/7848; H01L 21/02112; H01L 29/0649; H01L 21/02236; H01L 21/02164;
(Continued)

(56) References Cited

U.S. PATENT DOCUMENTS 7,667,271 B2 2/2010 Yu et al.
8,362,575 B2 1/2013 Kwok et al.
(Continued)

FOREIGN PATENT DOCUMENTS

CN 103295963 A 9/2013
CN 106328589 A 1/2017

OTHER PUBLICATIONS

Office Action dated Nov. 28, 2016 issued in Taiwan Patent Application No. 10521460810.
(Continued)

*Primary Examiner* — Latanya N Crawford
(74) *Attorney, Agent, or Firm* — McDermott Will & Emery LLP

(57) ABSTRACT

A fin field effect transistor (Fin FET) device includes a fin structure extending in a first direction and protruding from an isolation insulating layer disposed over a substrate. The fin structure includes a well layer, an oxide layer disposed over the well layer and a channel layer disposed over the oxide layer. The Fin FET device includes a gate structure covering a portion of the fin structure and extending in a second direction perpendicular to the first direction. The Fin FET device includes a source and a drain. Each of the source and drain includes a stressor layer disposed in recessed portions formed in the fin structure. The stressor layer extends above the recessed portions and applies a stress to a channel layer of the fin structure under the gate structure. The Fin FET device includes a dielectric layer formed in
(Continued)

contact with the oxide layer and the stressor layer in the recessed portions.

20 Claims, 13 Drawing Sheets

(51) Int. Cl.
| | |
|---|---|
| H01L 21/84 | (2006.01) |
| H01L 21/02 | (2006.01) |
| H01L 21/3115 | (2006.01) |
| H01L 27/12 | (2006.01) |
| H01L 29/66 | (2006.01) |
| H01L 29/165 | (2006.01) |

(52) U.S. Cl.
CPC .. *H01L 21/02164* (2013.01); *H01L 21/02236* (2013.01); *H01L 21/3115* (2013.01); *H01L 21/845* (2013.01); *H01L 27/1211* (2013.01); *H01L 29/0649* (2013.01); *H01L 29/165* (2013.01); *H01L 29/66636* (2013.01); *H01L 29/66795* (2013.01); *H01L 29/785* (2013.01); *H01L 21/02255* (2013.01)

(58) Field of Classification Search
CPC . H01L 29/165; H01L 21/845; H01L 21/3115; H01L 27/1211; H01L 29/66636; H01L 21/0228; H01L 21/02255
See application file for complete search history.

(56) References Cited

U.S. PATENT DOCUMENTS

| | | | |
|---|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,263,342 B2 | 2/2016 | Lee et al. |
| 9,425,313 B1 | 8/2016 | Chen et al. |
| 9,443,769 B2 | 9/2016 | Wang et al. |
| 9,773,705 B2 | 9/2017 | Ching et al. |
| 9,997,616 B2 | 6/2018 | Yuan et al. |
| 2011/0068407 A1 | 3/2011 | Yeh et al. |
| 2013/0011983 A1 | 1/2013 | Tsai et al. |
| 2013/0228862 A1 | 9/2013 | Lee et al. |
| 2013/0264643 A1 | 10/2013 | Lee et al. |
| 2014/0084369 A1 | 3/2014 | Murthy et al. |
| 2014/0197456 A1 | 7/2014 | Wang et al. |
| 2014/0252412 A1 | 9/2014 | Tsai et al. |
| 2014/0264592 A1 | 9/2014 | Oxland et al. |
| 2014/0312432 A1 | 10/2014 | Ching et al. |
| 2015/0076558 A1 | 3/2015 | Lee et al. |
| 2015/0102411 A1 | 4/2015 | Ching et al. |
| 2015/0144998 A1 | 5/2015 | Ching et al. |
| 2016/0027918 A1 | 1/2016 | Kim et al. |
| 2016/0204260 A1 | 7/2016 | Ching |
| 2016/0240681 A1 | 8/2016 | Ching et al. |
| 2016/0247901 A1 | 8/2016 | Yuan et al. |
| 2016/0254351 A1 | 9/2016 | Tsai |
| 2016/0268312 A1 | 9/2016 | Wang et al. |
| 2016/0308048 A1 | 10/2016 | Ching et al. |
| 2016/0343845 A1 | 11/2016 | Chen |
| 2017/0005002 A1 | 1/2017 | Ching et al. |
| 2018/0025946 A1 | 1/2018 | Ching et al. |

OTHER PUBLICATIONS

Office Action dated Sep. 23, 2016 issued in parent U.S. Appl. No. 14/833,022.
Office Action dated Apr. 20, 2017 issued in parent U.S. Appl. No. 14/833,022.
Office Action dated Aug. 4, 2017 issued in parent U.S. Appl. No. 14/833,022.
Office Action dated Feb. 22, 2018 issued in parent U.S. Appl. No. 11/833,022.

SEMICONDUCTOR DEVICE AND MANUFACTURING METHOD THEREOF

CROSS-REFERENCE TO RELATED APPLICATIONS

This application is a continuation patent application of U.S. patent application Ser. No. 14/833,022, filed on Aug. 21, 2015, now U.S. patent Ser. No. 10/164,096, the entire disclosure of which is incorporated herein by reference.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon phosphide (SiP) or silicon carbide (SiC) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
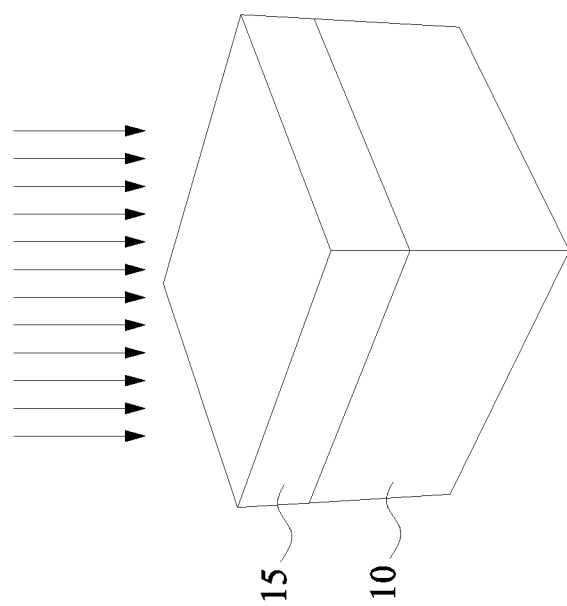

In FIG. 1, impurity ions (dopants) are implanted into a silicon substrate 10 to form a well region 15. The ion implantation is performed to prevent a punch-through effect.

The substrate 10 is, for example, a p-type silicon substrate with an impurity concentration in a range of about $1 \times 10^{15}$ cm$^{-3}$ and about $1 \times 10^{18}$ cm$^{-3}$. In other embodiments, The substrate 10 is an n-type silicon substrate with an impurity concentration in a range of about $1 \times 10^{15}$ cm$^{-3}$ and about $1 \times 10^{18}$ cm$^{-3}$. The Si substrate 10 has a (100) upper surface in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The dopants are, for example boron (BF$_2$) for an n-type Fin FET and phosphorus for a p-type Fin FET.

Figure 2:
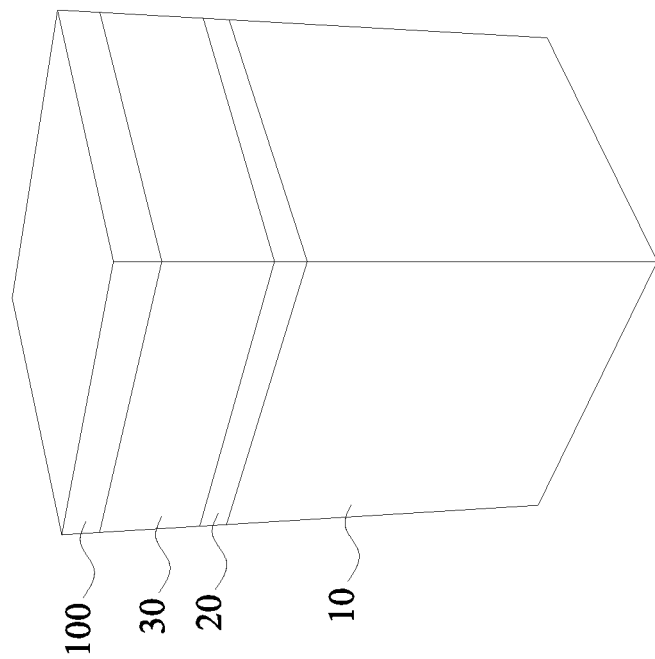
FIGS. 1-19 are exemplary processes for manufacturing a semiconductor FET device having a fin structure (Fin FET) according to one embodiment of the present disclosure.

As shown in FIG. 2, a first epitaxial layer 20 is epitaxially grown over the surface of the substrate 10, and a second epitaxial layer 30 is epitaxially grown over the first epitaxial layer. Further, a mask layer 100 is formed over the second epitaxial layer 30.

The first epitaxial layer 20 may be, for example Ge or Si$_{(1-x)}$Ge$_x$, where x is in a range of about 0.1 to about 0.9. In this embodiment, Si$_{(1-x)}$Ge$_x$ is used as the first epitaxial layer. In the present disclosure, Si$_{1-x}$Ge$_x$ may be simply referred to as SiGe. The thickness of the SiGe first epitaxial layer 20 is in a range of about 10 nm to about 100 nm in some embodiments. In certain embodiments, the thickness of the SiGe first epitaxial layer 20 is in a range of about 1 nm to about 20 nm, or in a range of about 2 nm to 10 nm in other embodiments.

The second epitaxial layer 30 may be, for example Si or Si$_{(1-y)}$Ge$_y$, where y<x. In this embodiment, Si is used as the second epitaxial layer 30. The Si second epitaxial layer 30 has a thickness in a range of about 20 nm to about 70 nm in some embodiments. In certain embodiments, the thickness of the Si second epitaxial layer 30 is in a range of about 30 nm to about 50 nm.

The mask layer 100 may include, for example, a pad oxide (e.g., silicon oxide) layer and a silicon nitride (SiN) mask layer in some embodiments. The thickness of the pad oxide layer is in a range of about 2 nm to about 15 nm and the thickness of the silicon nitride mask layer is in a range of about 10 nm to about 50 nm in some embodiments. The mask layer is SiN in this embodiment.

By using patterning operations, the mask layer 100 is patterned into mask patterns 105. The width of each of the mask patterns 105 is in a range of about 5 nm to about 40 nm in some embodiments, or may be in a range of about 10 nm to about 30 nm in other embodiments.

Figure 3:
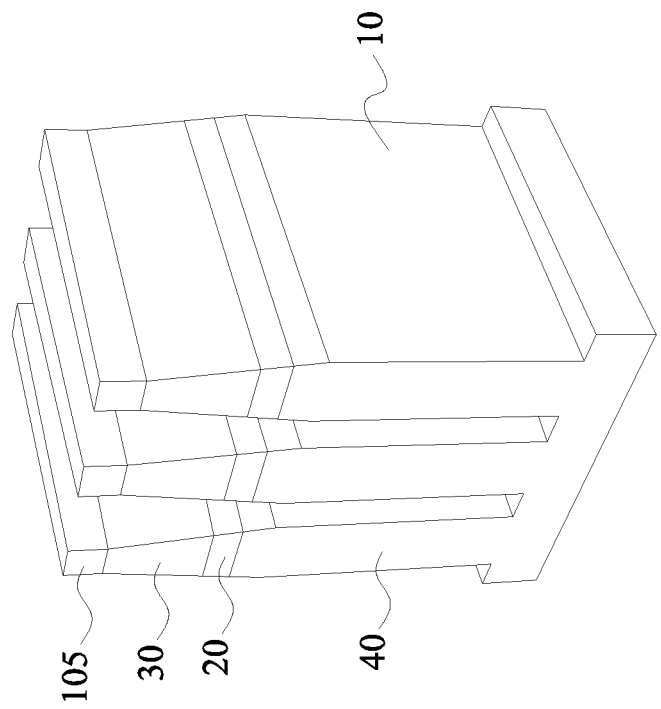

As shown in FIG. 3, by using the mask patterns 105 as etching masks, the second epitaxial layer 30, the first epitaxial layer 20 and the substrate 10 are pattered into fin structures 40 by trench etching using a dry etching method and/or a wet etching method.

As shown in FIG. 3, three fin structures 40 are disposed adjacent to each other. However, the number of the fin structures is not limited to three. The numbers may be one, two, four or five or more. In addition, one or more dummy fin structures may be disposed adjacent to both sides of the fin structures 40 to improve pattern fidelity in patterning processes. The width of the fin structure 40 is in a range of about 5 nm to about 40 nm in some embodiments, and may be in a range of about 7 nm to about 15 nm in certain embodiments. The height of the fin structure 40 is in a range of about 100 nm to about 300 nm in some embodiments, and may be in a range of about 50 nm to 100 nm in other embodiments. The space between the fin structures 40 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

Figure 4:
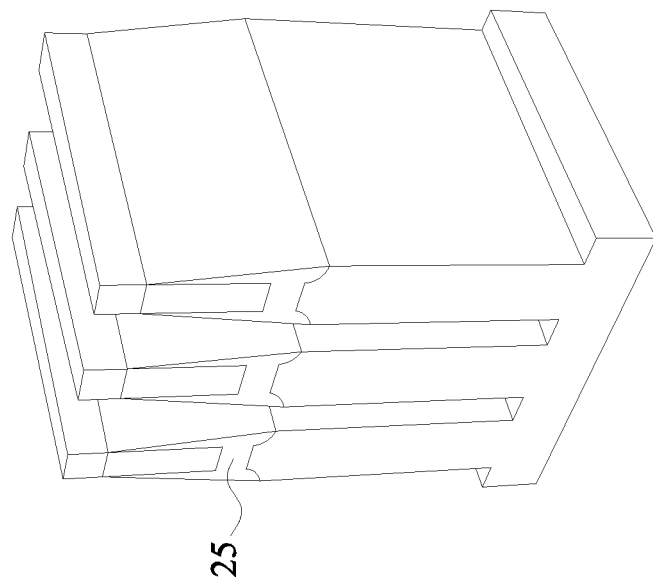

As shown in FIG. 4, the SiGe first epitaxial layer 20 in the fin structures 40 is oxidized to form SiGe oxide layer 25. Since SiGe (in particular Ge) is oxidized faster than Si, the SiGe oxide layer 25 can be selectively formed. However, side walls of the Si first epitaxial layer 30 and the Si substrate 10 may also be slightly oxidized to form silicon oxide. The SiGe layer can be oxidized by an annealing or heating in an atmosphere containing oxygen ($O_2$), and hydrogen ($H_2$) or steam ($H_2O$). In this embodiment, wet oxidation using steam is performed at a temperature range of about 400° C. to about 600° C., at about atmospheric pressure. The thickness of the SiGe oxide layer is in a range of about 5 nm to 25 nm in some embodiments, or about 10 nm to 20 nm in other embodiments.

Figure 5:
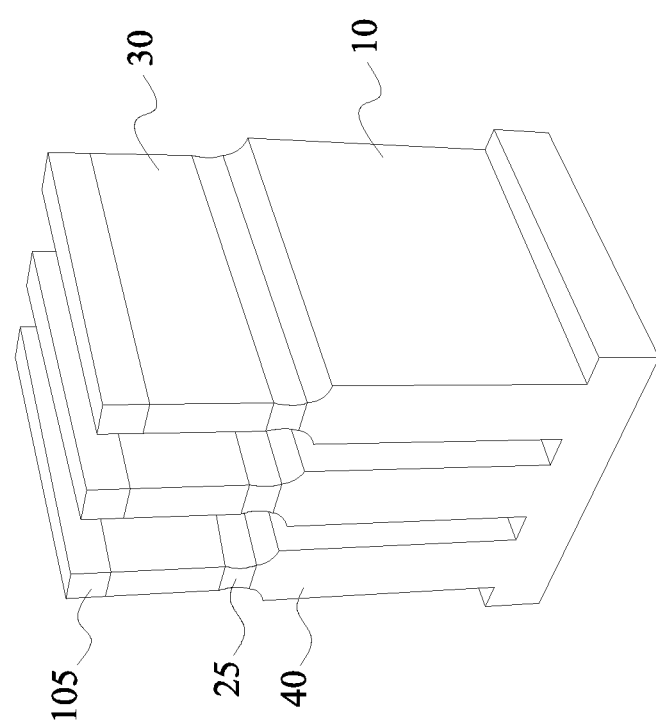

As shown in FIG. 5, part of the SiGe oxide layer 25 is removed, by using, for example, wet etching. The etchant of the wet etching may be dilute HF. By adjusting the etching conditions (e.g., etching time), the silicon oxide formed on the side walls of the Si first epitaxial layer 30 and the Si substrate 10 is removed. The SiGe oxide layer 25 is also slightly etched.

Next, an isolation insulating layer 50 is formed. The isolation insulating layer 50 is made of, for example, one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

Figure 6:
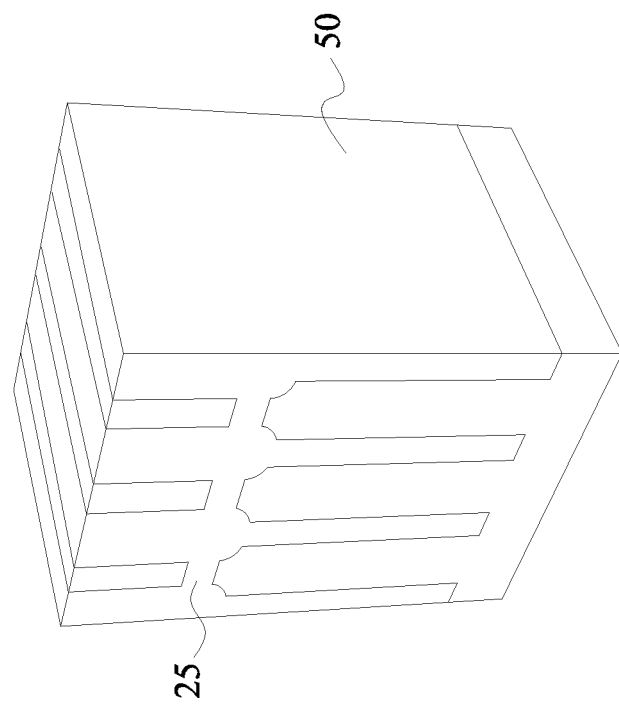

Further, the mask patterns 105 and a top portion of the isolation insulating layer 50 are removed by, for example, a chemical mechanical polishing (CMP) method or other planarization methods such as an etch-back process. The resultant structure is shown in FIG. 6.

After forming the isolation insulating layer 50, a thermal process, for example, an anneal process, may be performed to improve the quality of the isolation insulating layer 50. The thermal process may be performed before or after the planarization operations.

Figure 7:
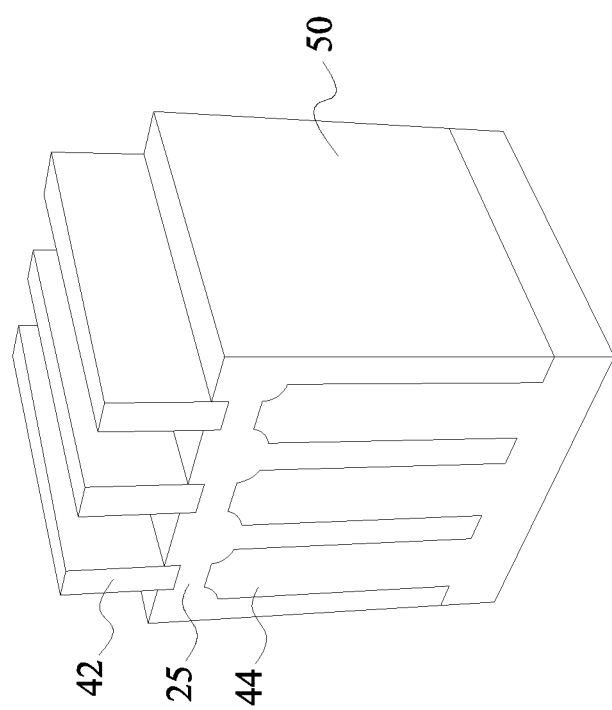

As shown in FIG. 7, the thickness of the isolation insulating layer 50 is reduced by, for example, an etch-back process so as to expose a part of the fin structure 40. The exposed part 42 of the fin structure 40 becomes a channel layer of the Fin FET and the embedded part in the isolation insulating layer becomes a well layer 44 of the Fin FET. The etch-back process may be performed by using dry etching or wet etching. By adjusting etching time, a desired thickness of the remaining isolation insulating layer 50 can be obtained.

In FIG. 7, the SiGe oxide layer 25 is not exposed from the isolation insulating layer 50, and the bottom of the channel layer 42 is embedded in the isolation insulating layer 50. However, in some embodiments, the SiGe oxide layer 25 and the entire channel layer 42 may be exposed from the isolation insulating layer 50. In the present embodiment, a channel on oxide structure is formed to include the channel layer 42 on the SiGe oxide layer 25.

Figure 8:
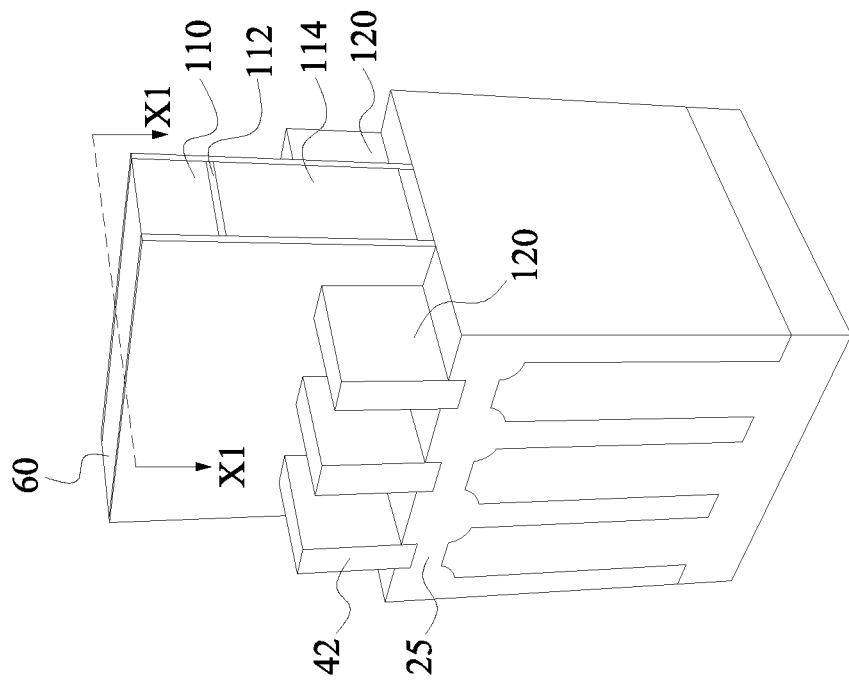

As shown in FIG. 8, a gate structure 60 is formed over part of the channel layer 42 of the fin structures 40. A gate dielectric layer 115 and an electrode layer are formed over the isolation insulating layer 50 and the channel layer 42, and then patterning operations are performed so as to obtain gate structure 60 including a gate electrode layer 114 and the gate dielectric layer 115. The gate electrode layer 114 is made of poly silicon in this embodiment. The patterning of the poly silicon layer is performed by using a hard mask including a silicon nitride layer 112 and an oxide layer 110 in some embodiments. In other embodiments, the layer 112 may be silicon oxide and the layer 110 may be silicon nitride. The gate dielectric layer 115 may include one or more layers of a dielectric material formed by CVD, PVD, ALD, e-beam evaporation, or other suitable process.

In one embodiment, a gate-last technology (a gate replacement technology) is employed. In the gate-last technology, the gate electrode layer 114 and the gate dielectric layer 115 formed in the foregoing operations are a dummy electrode layer and a dummy gate dielectric layer, respectively, which are eventually removed.

In the alternative, a gate-first technology may be employed in other embodiments. In such a case, the gate electrode layer 114 and the gate dielectric layer 115 are used as a gate electrode and a gate dielectric layer of a Fin FET.

In some embodiments, the gate dielectric layer 115 may include one or more layers of a dielectric material, such as silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer 115 is in the range of about 1 nm to 5 nm. In some embodiments, the gate electrode layer 114 may comprise a single layer or multilayer structure.

Further, the gate electrode layer 114 may be doped poly-silicon with uniform or non-uniform doping. In some alternative embodiments, the gate electrode layer 114 may include one or more layers of a metal such as Al, Cu, W, Ti, Ta, TiN, TiAl, TiAlN, TaN, NiSi, CoSi, other conductive materials with a work function compatible with the substrate material, or combinations thereof. The gate electrode layer 114 may be formed using a suitable process such as ALD, CVD, PVD, plating, or combinations thereof. The width of the gate electrode layer 114 is in the range of about 30 nm to about 60 nm in some embodiments.

Further, as shown in FIG. 8, side wall insulating layers 120 are formed over vertical main side walls of the gate structure 60 and vertical main side walls of the channel layer 42 not covered by the gate structure 60. The side wall insulating layers 120 may include one or more layers of a dielectric material, such as silicon oxide, silicon nitride and/or silicon oxynitride. The material of the side wall insulating layers 120 is silicon nitride in this embodiment.

To form the side wall insulating layer 120, a blanket layer of silicon nitride is formed over the entire structure by using CVD and etch-back operations are performed.

Figure 9:
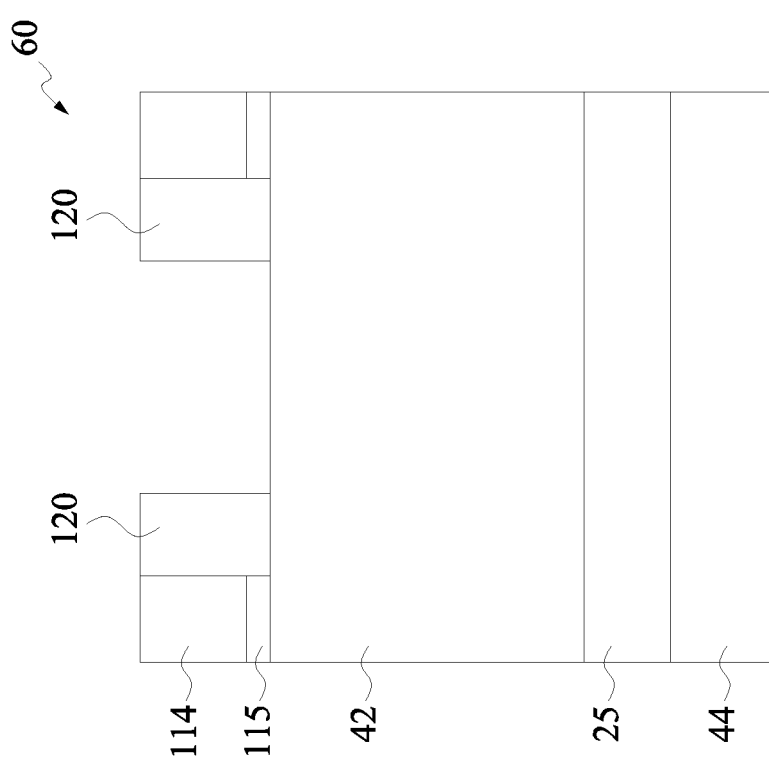

FIG. 9 shows a cross sectional view along line X1-X1 of FIG. 8 cutting one channel layer 42 under the gate structure 60. In FIGS. 9-16, the upper portion of the gate structure 60 is not shown. While FIG. 8 shows one gate structure 60, in FIG. 9, two gate structures are illustrated. However, the number of the gate structure per fin structure is not limited to one or two. The numbers may be three, four or five or more.

Figure 10:
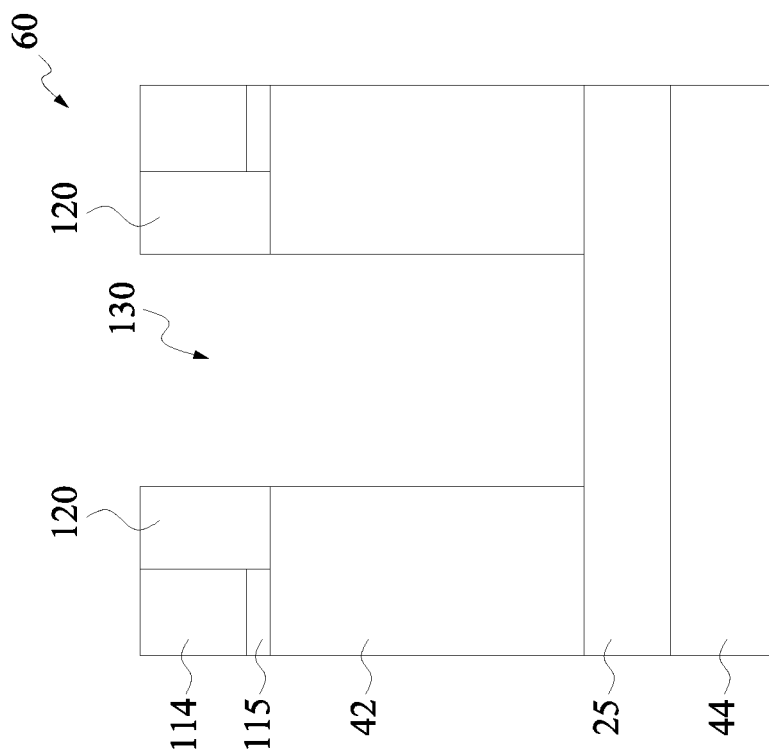

As shown in FIG. 10, portions of the channel layer 42 not covered by the gate structures 60 are etched to form recessed portion 130. The recessed portion 130 is formed until the SiGe oxide layer 25 is exposed. The recess etching of the channel layer 42 is performed by plasma etching using gases including $CH_4$, $CF_4$, $CH_2F_2$, $CHF_3$, $O_2$, HBr, $Cl_2$, $NF_3$, $N_2$ and/or He under the pressure of 3 to 20 mTorr, in some embodiments. The recess etching generates an anisotropic etching profile.

Figure 12:
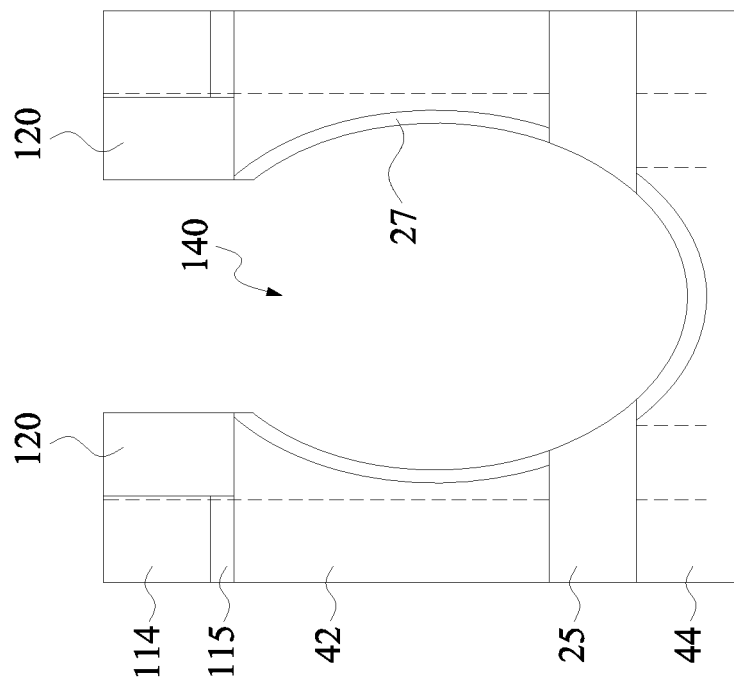
Figure 11:
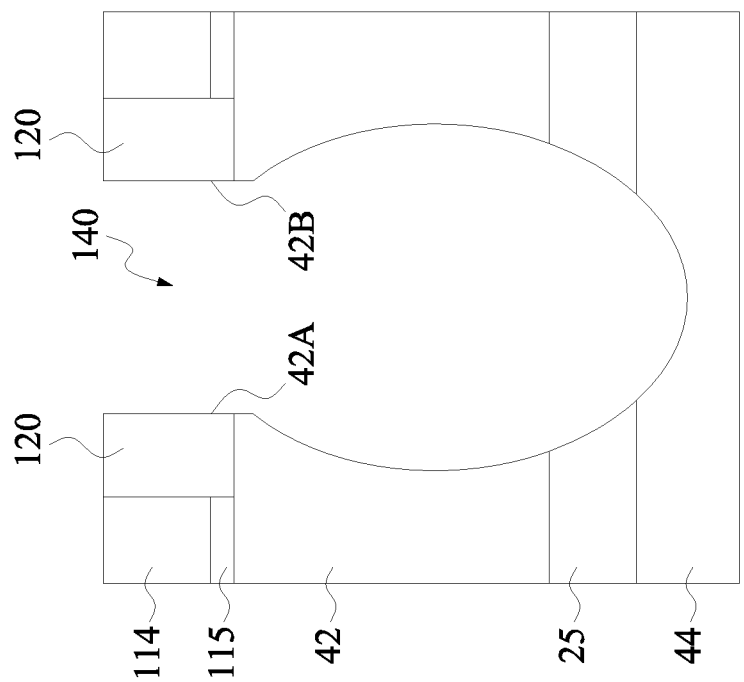

As shown in FIG. 11, part of the SiGe oxide layer 25 is etched by dry etching and/or wet etching. This etching generates an isotropic etching profile. During the etching of SiGe oxide layer 25, part of the channel layer 42 and well layer 44 are also etched to form a recessed portion 140. As shown in FIG. 11, the recessed portion 140 is defined by the uppermost surface of the channel layer 42, such as 42A or 42B. A material or structure may be located in the recessed portion 140 as located equal to or below the uppermost surface of the channel layer 42, such as 42A or 42B. A material or structure may be located above the recessed portion 140 as located above the uppermost surface of the channel layer 42, such as 42A or 42B. As shown in FIG. 12, the surfaces of the channel layer 42 and the well layer 44 in the recessed portion 140 are modified to form a dielectric layer 27. The dielectric layer 27 may include one or more layers of a dielectric material such as silicon oxide. Since epitaxial materials (e.g., silicon based materials) do not grow on the dielectric layer 27, the dielectric layer is used to control the profile of epitaxy. In some embodiments, the dielectric layer 27 may be formed by slightly oxidizing the surfaces of the channel layer 42 and the well layer 44 by using an annealing or heating process in an atmosphere containing oxygen ($O_2$), and hydrogen ($H_2$) or steam ($H_2O$). In some embodiments, wet oxidation using steam is performed at a temperature range of about 400° C. to about 600° C., at about atmospheric pressure. The thickness of the dielectric layer 27 is in a range of about 1 nm to about 10 nm in some embodiments.

Figure 13:
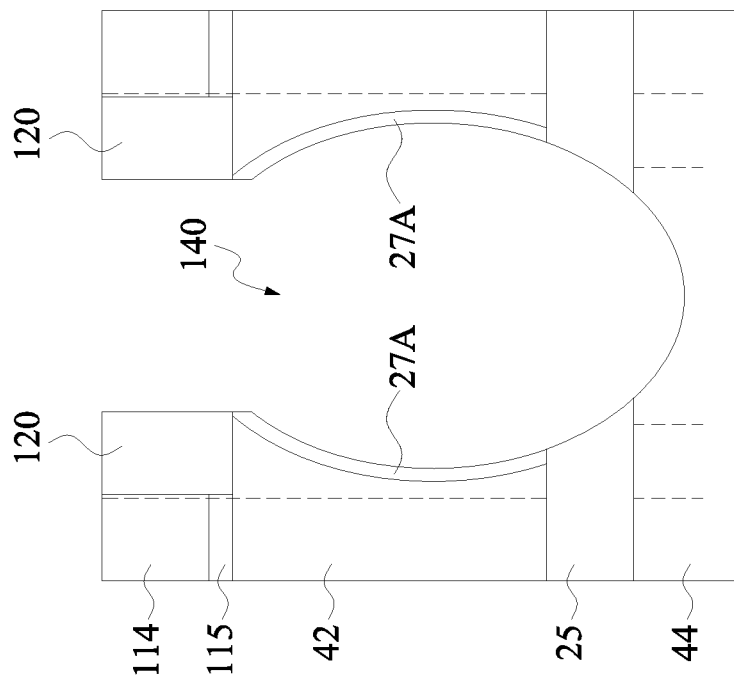

As shown in FIG. 13, a portion of the dielectric layer 27 that covers the well layer 44 in the recessed portion 140 is removed by an etching process. The dielectric layer 27A is the remaining part of the dielectric layer 27 after the etching process. The etching process may be a dry etching process, such as performed by using $NF_3$, $NH_3$, $Cl_2$, HBr, and/or HF as etching gases in some embodiments. The etching process may generate an anisotropic etching profile. In the present embodiment, the anisotropy of the etching profile may be controlled due to the directionality of the etching process, to minimize the etching of the dielectric layer 27A.

Figure 14:
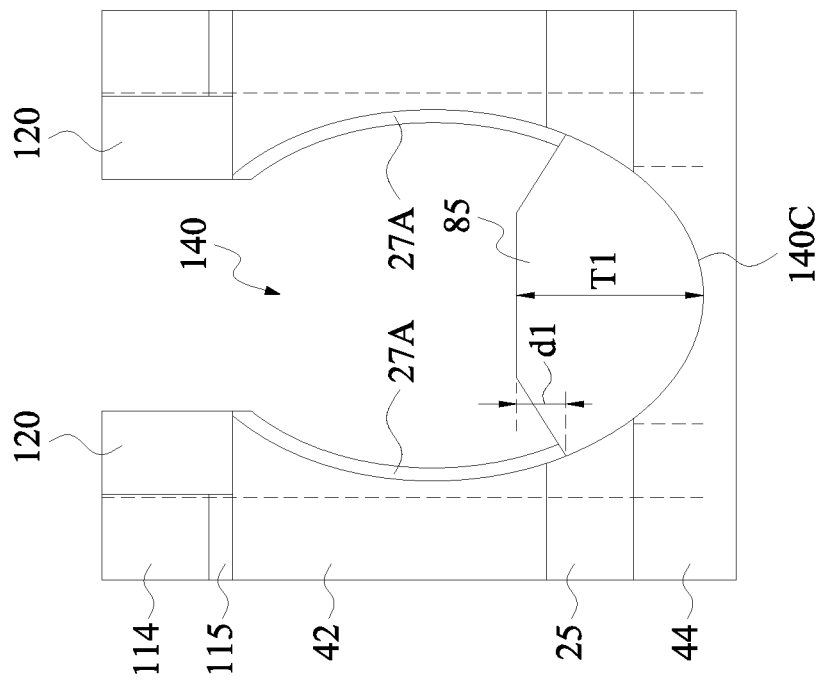

As shown in FIG. 14, a first epitaxial layer 85, which may include a SiGe epitaxial layer, is formed over the well layer 44 and the SiGe oxide layer 25. The thickness T1 of the first epitaxial layer 85 measured from the bottom of the recessed portion 140 is equal to or less than 25 nm in some embodiments. In some embodiments, the uppermost surface of the first epitaxial layer 85 is located above the uppermost surface of the SiGe oxide layer 25. The distance (space d1) between the uppermost surface of the first epitaxial layer 85 and the uppermost surface of the SiGe oxide layer 25 is in a range of 5 nm to about 25 nm in some embodiments. The Ge content of the SiGe first epitaxial layer 85 is in a range of about 0% to about 35% in some embodiments. The SiGe first epitaxial layer 85 may be undoped. Since the surfaces of the channel layer 42 are covered by the dielectric layer 27A, the first epitaxial layer 85 is not formed on the surfaces of the channel layer 42. As a result, the first epitaxial layer 85 may contain a bottom-up epitaxial profile, in which the center portion may be higher than the peripheral portion, in the recessed portion 140. The first epitaxial layer 85 may be formed by a co-flow CVD operation with one or more precursors and gases flowing together. In some embodiments, the co-flow CVD operation may include hydrogen chloride in the gas flow, for example, with a flow rate of about 10 sccm to about 1000 sccm. In some embodiments, the temperature for the co-flow CVD operation is in the range of about 550° C. to about 800° C.

Figure 15:
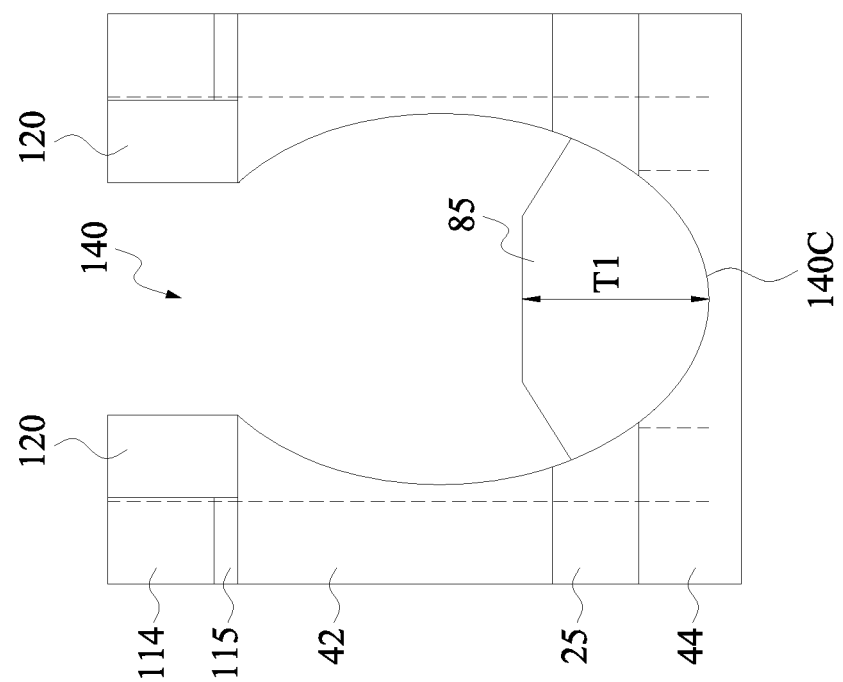

After the first epitaxial layer 85 is formed, as shown in FIG. 15, the dielectric layer 27A is removed by an etching process. The etching process may be a dry etching process and/or a wet etching process. The wet etching process may be performed by using dilute HF in some embodiments. The dry etching process may be performed by using $NF_3$, $NH_3$, $Cl_2$, HBr, and/or HF as etch gases in some embodiments.

The etching process generates an isotropic etching profile. By adjusting the etching conditions (e.g., etching time), the dielectric layer 27A formed on the side walls of the channel layer 42 is removed.

Figure 16:
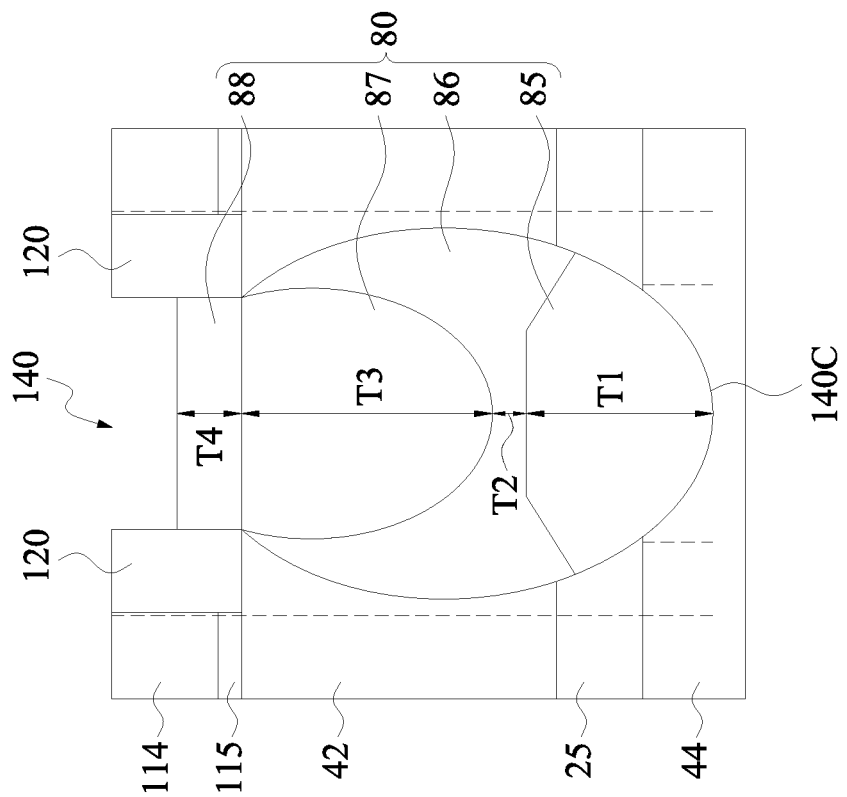

As shown in FIG. 16, a second epitaxial layer 86, which may include a SiGe epitaxial layer, is formed over the first epitaxial layer 85. The thickness T2 of the second epitaxial layer 86 at the center of the recessed portion 140 (140C) is in a range of more than 0 nm to about 25 nm in some embodiments. The Ge content of the SiGe second epitaxial layer 86 is in a range of about 0% to about 35% in some embodiments. The Ge content of the SiGe second epitaxial layer 86 is larger than that of the SiGe first epitaxial layer 85 in some embodiments. The SiGe second epitaxial layer 86 may include p-type impurities such as boron (B) in an amount of about $1 \times 10^{20}$ cm$^{-3}$ to about $6 \times 10^{20}$ cm$^{-3}$ in some embodiments. Since the second epitaxial layer 86 is formed on the surfaces of the channel layer 42 and the first epitaxial layer 85, the first epitaxial layer 85 and the second epitaxial layer 86 can be formed without forming defects or voids.

A third epitaxial layer 87, which may include a SiGe epitaxial layer, is formed over the second epitaxial layer 86 as shown in FIG. 16. The thickness T3 of the third epitaxial layer 87 at the center of the recessed portion 140 (140C) is in a range of about 10 nm to about 60 nm in some embodiments. The Ge content of the SiGe third epitaxial layer 87 is in a range of about 20% to about 80% in some embodiments. The Ge content of the SiGe third epitaxial layer 87 is larger than that of the SiGe second epitaxial layer 86 and/or the SiGe first epitaxial layer 85 in some embodiments.

The SiGe third epitaxial layer 87 may include p-type impurities such as boron (B) in an amount of about $5 \times 10^{20}$ cm$^{-3}$ to about $2 \times 10^{21}$ cm$^{-3}$ in some embodiments. The impurity amount in the SiGe third epitaxial layer 87 is larger than that in the SiGe second epitaxial layer 86 in some embodiments.

In some embodiments, the first epitaxial layer 85, the second epitaxial layer 86, and/or the third epitaxial layer 87 may be formed in the recessed portion 140, such as below the uppermost surface of the channel layer 42, such as 42A or 42B.

As shown in FIG. 16, a fourth epitaxial layer 88, which may include a SiGe epitaxial layer, is formed over the third epitaxial layer 87. In some embodiments, the fourth epitaxial layer 88 may be formed above the recessed portion 140. That is, the fourth epitaxial layer 88 is formed above the uppermost surface of the channel layer 42, such as 42A or 42B. The thickness T4 of the fourth epitaxial layer 88 at the center of the recessed portion 140 (140C) is in a range of more than 0 nm to about 20 nm in some embodiments. The Ge content of the SiGe fourth epitaxial layer 88 is in a range of about 0% to about 35% in some embodiments.

The Ge content of the SiGe fourth epitaxial layer 88 is smaller than that of the SiGe third epitaxial layer 87 and larger than that of the SiGe second epitaxial layer 86 and/or the SiGe first epitaxial layer 85 in some embodiments. In other embodiments, the Ge content of the SiGe fourth epitaxial layer 88 is smaller than that of the SiGe second epitaxial layer 86 and/or the SiGe first epitaxial layer 85. The SiGe fourth epitaxial layer 88 may include p-type impurities such as boron (B) in an amount of about $3 \times 10^{20}$ cm$^{-3}$ to about $5 \times 10^{21}$ cm$^{-3}$ in some embodiments. The impurity amount in the SiGe fourth epitaxial layer 88 is smaller than that in the SiGe third epitaxial layer 87 in some embodiments.

In the present embodiment, the first, second, third and fourth epitaxial layers may be formed in a bottom-up profile, due to the formation and removal of the dielectric layer 27 described above. Thus, the first, second, third the fourth epitaxial layers may be formed without forming defects or voids, for example, in between each of the layers. In addition, (111) planes of epitaxy profile may be suppressed by suppressing epitaxial growth from the channel layer 42.

As shown in FIG. 16, a source/drain epitaxial layer 80 includes the first epitaxial layer 85, the second epitaxial layer 86, the third epitaxial layer 87, and the fourth epitaxial layer 88. The epitaxial layer 80 functions as a stressor layer to provide appropriate stress to the channel layer 42 under the gate structure. In some embodiments, the source/drain epitaxial layer 80 applies tensile stress to the channel layer of the n-type Fin FET to enhance carrier mobility. By modifying the materials of the epitaxial layers, the source/drain epitaxial layer 80 may apply compressive stress to the channel layer of the p-type Fin FET to enhance carrier mobility.

The source/drain epitaxial layer 80 with the channel on oxide structure may improve carrier mobility and suppress short channel effects, such as improving better drain induced barrier lowering (DIBL) control. In addition, a better strain and lower leakage of the Fin FET device may be provided.

In the present disclosure, the epitaxial layer 80 is formed by multiple epitaxial growth operations together with the use of the dielectric layer 27. If the epitaxial layer 80 is formed by one epitaxial process, epitaxial layers would be grown not only on the bottom of the recessed portion 140 over the well layer 44 but also on the channel layer 42. Such a lateral growth of the epitaxial layer on the channel layer 42 would cause a void or defect in the epitaxial layer 80. In contrast, in the present disclosure, by using the operations as set forth above using the dielectric layer 27, the lateral growth of the epitaxial layer during the epitaxial growth on the bottom the recessed portion 140 over the well layer 44 can be suppressed, thereby preventing a void or a defect from occurring and improving device performance.

Figure 17:
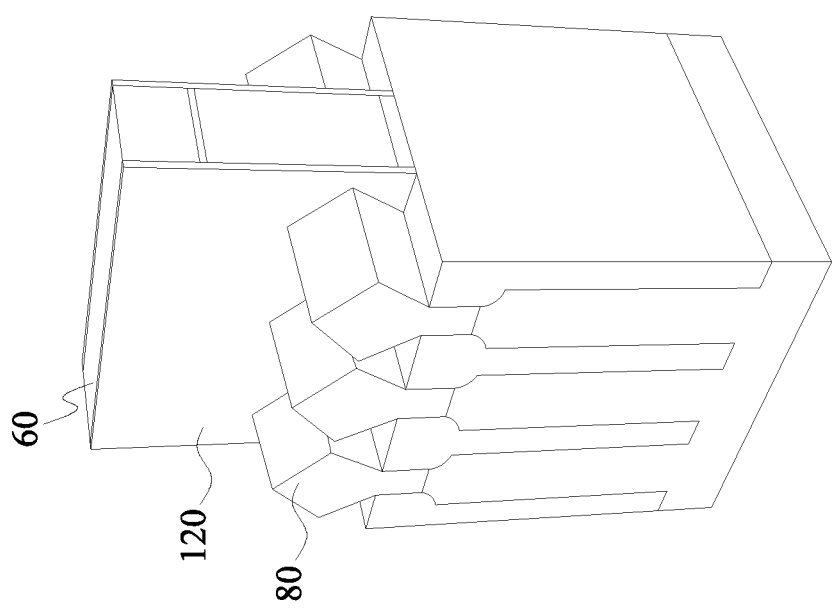

FIG. 17 is a perspective view of the Fin FET shown in FIG. 16. In addition, FIG. 17 shows the upper portions of the gate structure 60, which are not shown in FIGS. 9-16.

Figure 18:
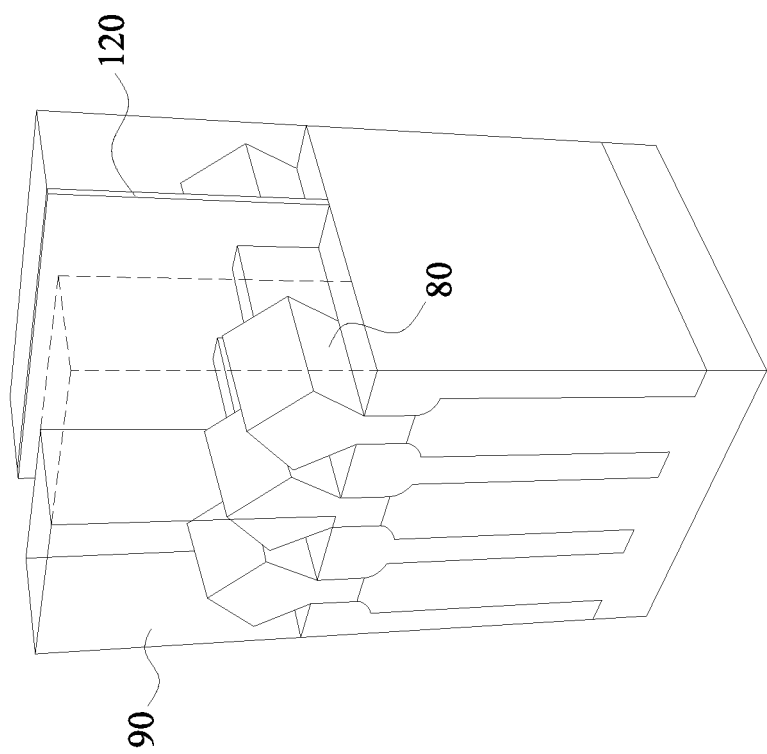

After forming the source/drain epitaxial layer 80, an interlayer dielectric layer 90 is formed over the structure of FIGS. 16 and 17. In one embodiment, a gate-last technology (a gate replacement technology) is employed. In the gate-last technology, the gate structure 60 is removed thereby forming a gate electrode space, as shown in FIG. 18. In the alternative, a gate-first technology may be employed in other embodiments. In such a case, the gate structure 60 may be used as a gate electrode and a gate dielectric layer of a Fin FET.

The interlayer dielectric layer 90 may include one or more layers of insulating materials such as silicon oxide, silicon nitride, silicon oxynitride (SiON), SiOCN, fluoride-doped silicate glass (FSG), or a low-K dielectric material, formed by CVD.

Figure 19:
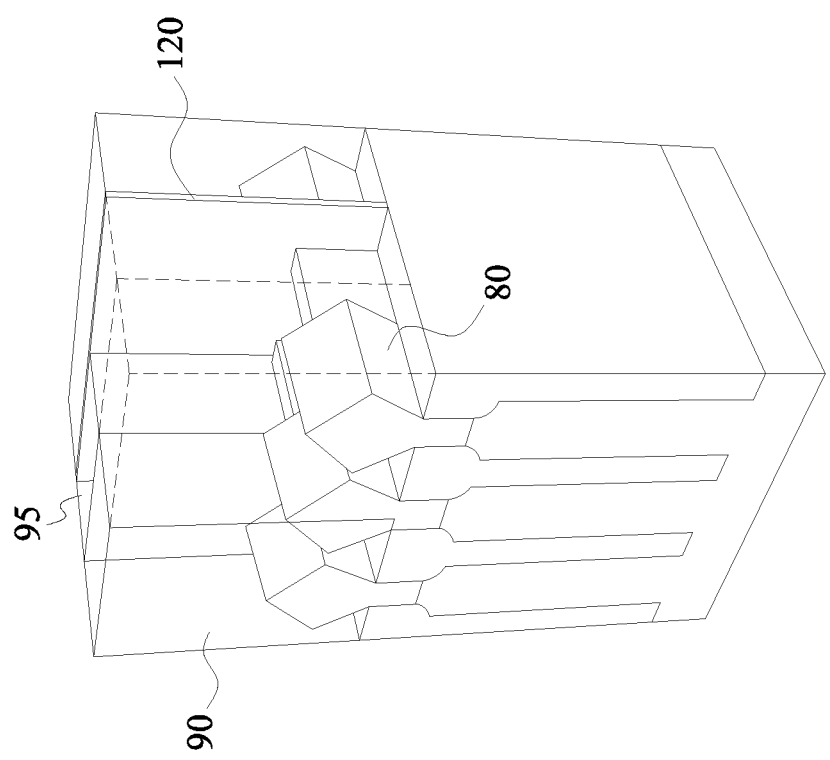

As shown in FIG. 19, a metal gate structure 95 is formed in the gate electrode space. The metal structure 95 includes a metal gate electrode layer and a gate dielectric layer (not shown in FIG. 19). The metal gate electrode layer may include a single layer or multilayer structure. In the present embodiment, the metal gate electrode layer includes one or more layers of a metal such as Al, Cu, W, Ti, Ta, TiN, TiAl, TiAlN, TaN, NiSi, CoSi, other conductive materials with a work function compatible with the substrate material, or combinations thereof. The metal gate electrode layer may be formed using a suitable process such as ALD, CVD, PVD, plating, or combinations thereof. The width of the metal gate electrode layer is in the range of about 30 nm to about 60 nm in some embodiments. In some embodiments, the gate dielectric layer may include one or more layers of a dielectric material, such as silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in the range of about 1 nm to 5 nm.

In some embodiments, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer. The work function adjustment layer may be formed separately for the n-channel Fin FET and the p-channel Fin FET which may use different metal layers.

It is understood that the Fin FET device as shown in FIG. 19 may undergo further CMOS processes to form various features such as contacts/vias, interconnect metal layers, dielectric layers, passivation layers, etc.

FIGS. 20-24 show cross sectional views of exemplary sequential processes of the Fin FET device according to a second embodiment. It is understood that additional operations can be provided before, during, and after processes shown by FIGS. 20-24, and some of the operations described below can be replaced or eliminated, for additional embodiments of the method. The order of the operations/processes may be interchangeable.

The manufacturing method of the Fin FET of the second embodiment includes the same steps shown in FIGS. 1-11.

Figure 20:
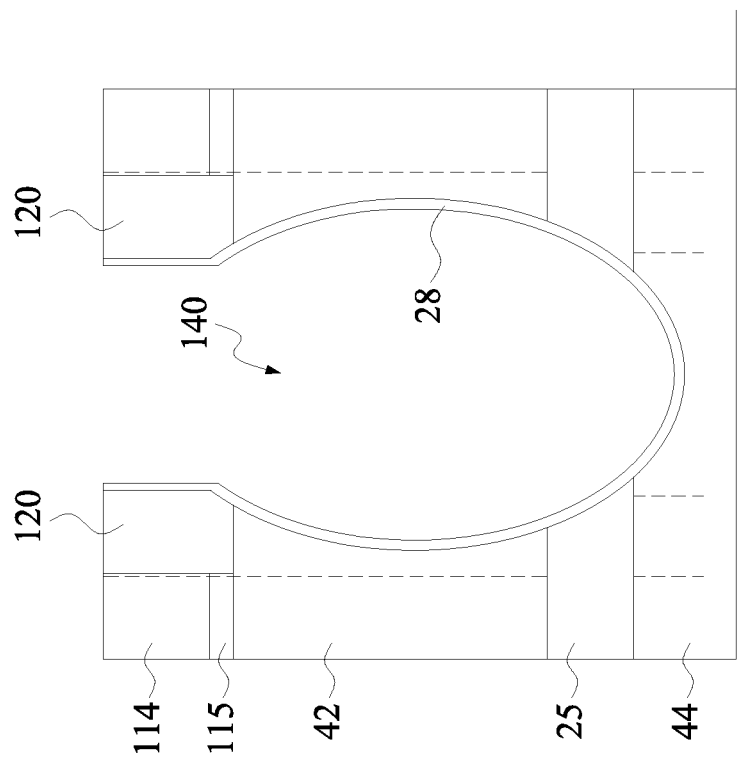
FIGS. 20-24 are exemplary processes for manufacturing a semiconductor FET device having a fin structure according to another embodiment of the present disclosure.

After the recessed portion 140 shown in FIG. 11 is formed, a dielectric layer 28 is formed to cover the surfaces of the channel layer 42, the well layer 44 in the recessed portion 140 and the insulating layers 120, as shown in FIG. 20. In some embodiments, the dielectric layer 28 includes one or more layers of dielectric material such as silicon oxide formed by atomic layer disposition, CVD, PVD, e-beam evaporation, or other suitable process. In some embodiments, the dielectric layer 28 may include one or more layers of silicon nitride, silicon oxynitride (SiON), SiCN, SiOCN or a low-K dielectric material, formed by atomic layer disposition, CVD, PVD, e-beam evaporation, ALD, or other suitable process. The thickness of the dielectric layer 28 is in a range of about 1 nm to about 10 nm in some embodiments. In some embodiments, the silicon oxide dielectric layer 28 may include p-type impurities such as boron (B) in an amount of about $5 \times 10^{20}$ cm$^{-3}$ and about $5 \times 10^{21}$ cm$^{-3}$. The p-type impurities may be diffused into the channel layer 42 to reduce channel resistivity for an n-type FET. In some embodiments, the silicon oxide dielectric layer 28 may include n-type impurities such as phosphorus (P) in an amount of about $5 \times 10^{20}$ cm$^{-3}$ and about $5 \times 10^{21}$ cm$^{-3}$. The n-type impurities may be diffused into the channel layer 42 to reduce channel resistivity for a p-type FET. In some embodiments, the silicon oxide dielectric layer 28 may be doped with carbon (C) in an amount of about $5 \times 10^{20}$ cm$^{-3}$ and $5 \times 10^{21}$ cm$^{-3}$.

Figure 21:
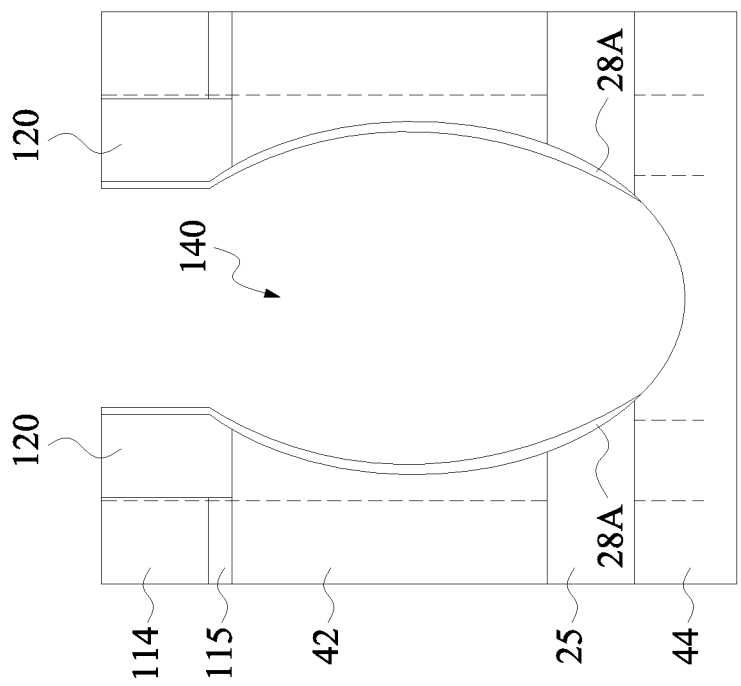

As shown in FIG. 21, a portion of the dielectric layer 28 that covers the well layer 44 in the recessed portion 140 is removed by an etching process. The dielectric layer 28A is the remaining part of the dielectric layer 28 after the etching process. The etching process may be a dry etching process, such as performed by using NF$_3$, NH$_3$, Cl$_2$, HBr, and/or HF as etch gases in some embodiments. The etching process may generate an anisotropic etching profile. In the present embodiment, the anisotropy of the etching profile may be controlled due to the directionality of the etching process, such as the dielectric layer 28A may remain on the surfaces of the channel layer 42, the SiGe oxide layer 25 and the insulating layers 120.

As described above, the dielectric layer 28 may include silicon oxide doped with carbon (C) in some embodiments. By doping with carbon, loss of the dielectric layer 28A can be reduced during one or more subsequent wet clean processes to remove residues of the silicon oxide dielectric layer 28 after the dry etching process.

Figure 22:
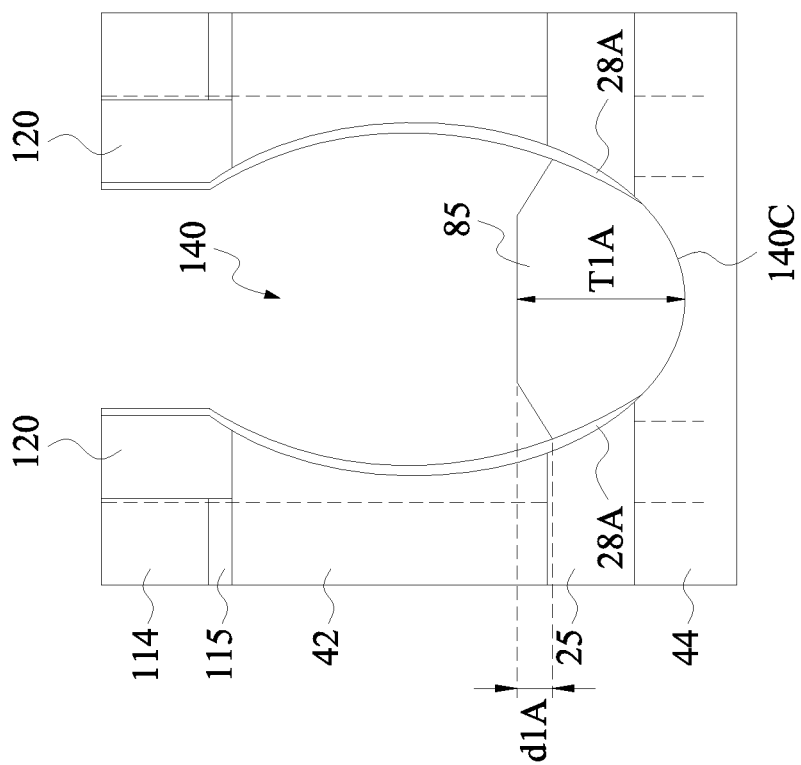

As shown in FIG. 22, a first epitaxial layer 85 may include a SiGe epitaxial layer formed over the well layer 44 and the dielectric layer 28A. The thickness T1A of the first epitaxial layer 85 at the center of the recessed portion 140 (140C) is not more than about 25 nm in some embodiments. In some embodiments, the uppermost surface of the first epitaxial layer 85 is located above the uppermost surface of the SiGe oxide layer 25. The distance d1A between the uppermost surface of the first epitaxial layer 85 and the uppermost surface of the SiGe oxide layer 25 is in a range of 5 nm to about 25 nm in some embodiments. The Ge content of the first epitaxial layer 85 is in a range of about 0% to about 35% in some embodiments. The SiGe first epitaxial layer 85 may be undoped.

Since the surfaces of the channel layer 42 are covered by the dielectric layer 28A, the first epitaxial layer 85 is not formed on the surfaces of the channel layer 42. As a result, the first epitaxial layer 85 may contain a bottom-up epitaxial profile. As noted above, the first epitaxial layer 85 may be formed by a co-flow CVD operation with one or more precursors and gases flowing together. In some embodiments, the co-flow CVD operation may include hydrogen chloride in the gas flow, for example, with a flow rate of about 10 sccm to about 1000 sccm. The temperature for the co-flow CVD operation is in the range of about 550° C. to about 800° C. in some embodiments.

Figure 23:
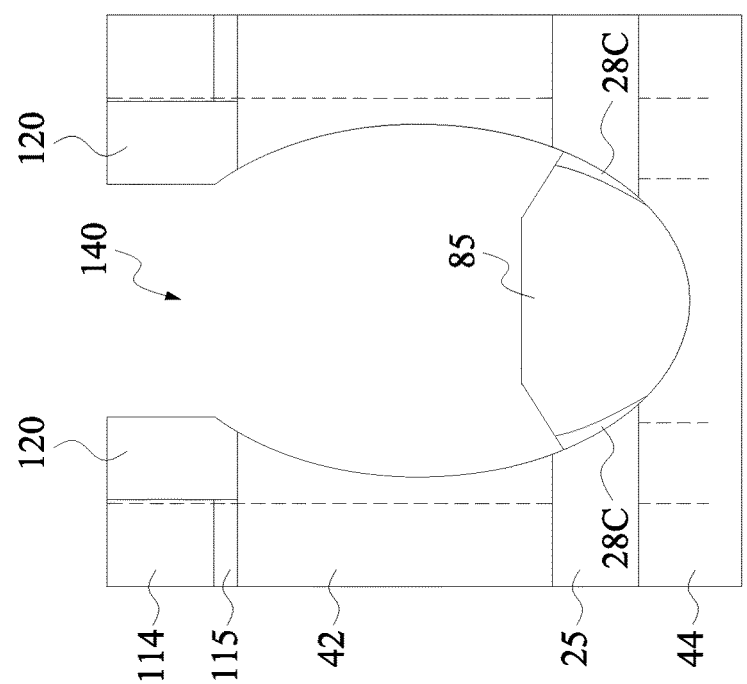

As shown in FIG. 23, a part of the dielectric layer 28A is removed by an etching process. The etching process may be a dry etching process or a wet etching process, such as performed by using dilute HF in some embodiments. The etching process generates an isotropic etching profile. The dielectric layer 28C is the remaining part of the dielectric layer 28 after the etching process.

Figure 24:
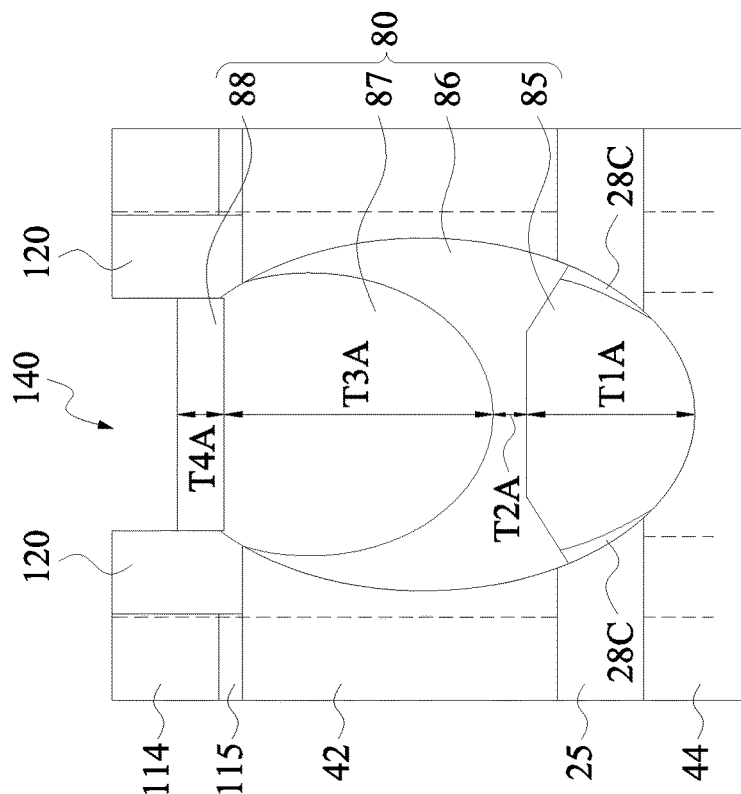

As shown in FIG. 24, a second epitaxial layer 86 may include a SiGe epitaxial layer formed over the first epitaxial layer 85. The thickness T2A of the second epitaxial layer 86 is in a range of more than 0 nm to about 20 nm in some embodiments. The Ge content of the second SiGe epitaxial layer 86 is in a range of about 0% to about 35% in some embodiments. The second SiGe epitaxial layer 86 may include p-type impurities such as boron (B) in an amount of about $1 \times 10^{20}$ cm$^{-3}$ to about $6 \times 10^{20}$ cm$^{-3}$ in some embodiments.

Since the second epitaxial layer 86 is formed on the surfaces of the channel layer 42 and the first epitaxial layer 85, the first epitaxial layer 85 and the second epitaxial layer 86 can be formed without forming defects or voids. A third epitaxial layer 87 may include a SiGe epitaxial layer formed over the second epitaxial layer 86 as shown in FIG. 24. The thickness T3A of the third epitaxial layer 87 is in a range of about 10 nm to about 60 nm in some embodiments. The Ge content of the SiGe third epitaxial layer 87 is in a range of about 20% to about 80% in some embodiments. The SiGe third epitaxial layer 87 may include p-type impurities such as boron (B) in an amount of about $5 \times 10^{20}$ cm$^{-3}$ to about $2 \times 10^{21}$ cm$^{-3}$ in some embodiments. As shown in FIG. 24, a fourth epitaxial layer 88 may include a SiGe epitaxial layer formed over the third epitaxial layer 87. The fourth epitaxial layer 88 may be formed above the height of the channel layer 42. The thickness T4A of the fourth epitaxial layer 88 is in a range of more than 0 nm to about 20 nm in some embodiments. The Ge content of the SiGe fourth epitaxial layer 88 is in a range of about 0% to about 35%. The SiGe fourth epitaxial layer 88 may include p-type impurities such as boron (B) in an amount of about $3 \times 10^{20}$ cm$^{-3}$ to about $5 \times 10^{21}$ cm$^{-3}$ in some embodiments.

As shown in FIG. 24, a source/drain epitaxial layer 80 includes the first epitaxial layer 85, the second epitaxial layer 86, the third epitaxial layer 87, and the fourth epitaxial layer 88. The epitaxial layer 80 functions as a stressor layer to provide appropriate stress to the channel layer 42 under the gate structure. In some embodiments, the second to fourth epitaxial layers apply tensile stress to the channel layer of the n-type Fin FET to enhance carrier mobility. In some embodiments, the second to fourth epitaxial layers apply compressive stress to the channel layer of the p-type Fin FET to enhance carrier mobility.

In some embodiments, the first epitaxial layer 85, the second epitaxial layer 86, and/or the third epitaxial layer 87 may be formed in the recessed portion 140, such as below the uppermost surface of the channel layer 42, such as 42A or 42B. In some embodiments, the fourth epitaxial layer 88 may be formed above the recessed portion 140. That is, the fourth epitaxial layer 88 is formed above the uppermost surface of the channel layer 42, such as 42A or 42B.

After forming the Fin FET device as shown in FIG. 24, the gate structure as shown in FIGS. 17-19 are formed and one or more subsequent operations may be performed associated with the gate structure.

Figure 26:
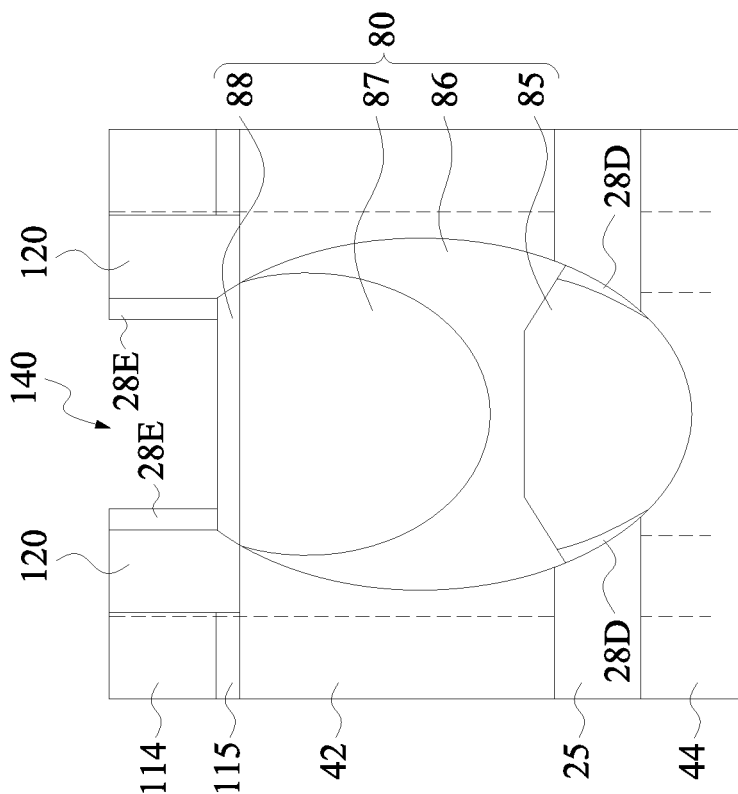
FIGS. 25-26 are exemplary processes for manufacturing a semiconductor FET device having a fin structure according to another embodiment of the present disclosure.
Figure 25:
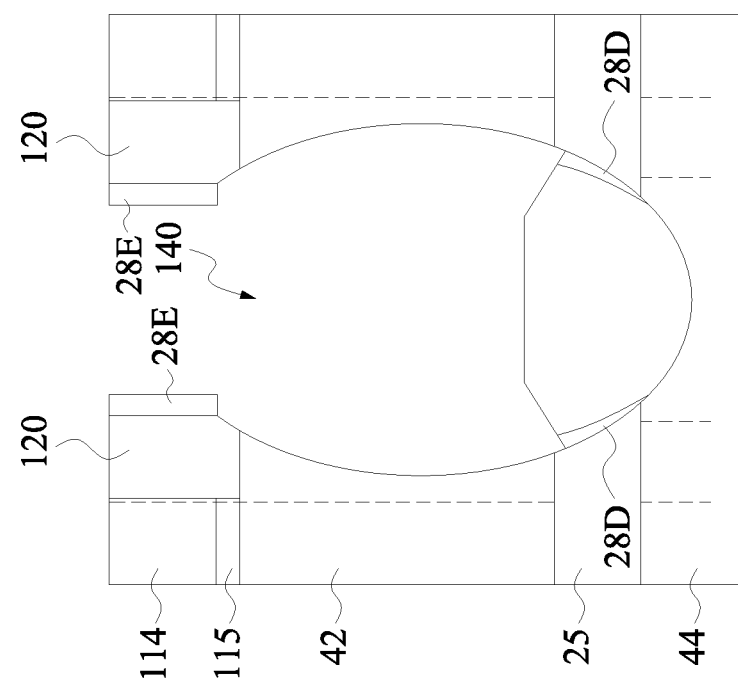

FIGS. 25-26 show cross sectional views of exemplary sequential processes of the Fin FET device according to another embodiment. It is understood that additional operations can be provided before, during, and after processes shown by FIGS. 25-26, and some of the operations described below can be replaced or eliminated, for additional embodiments of the method. The order of the operations/processes may be interchangeable.

The manufacturing method of the Fin FET of a third embodiment includes the same steps shown in FIGS. 20-22.

A portion of the dielectric layer 28 that covers the well layer 44 and the channel layer 42 in the recessed portion 140 are removed in some embodiments. Unlike FIG. 23, a portion of the dielectric layer 28 on the side wall insulating layers 120 is not removed. The dielectric layer 28D and 28E are the remaining parts of the dielectric layer 28 after the etching process, as shown in FIG. 25. The etching process may be a dry etching process, such as performed by using NF$_3$, NH$_3$, Cl$_2$, HBr, and/or HF as etch gases in some embodiments. The etching process may generate an anisotropic etching profile. In the present embodiment, the anisotropy of the etching profile may be controlled due to the directionality of the etching process. Compared with FIG. 23, the dielectric layer 28E is not removed during the etching process, and the dielectric layer 28E remains on the surfaces of the side wall insulating layers 120. With the dielectric layer 28E remaining on the surfaces of the side wall insulating layers 120, consumption of the side wall insulating layers 120 can be reduced in the subsequent operations.

As shown in FIG. 26, a source/drain epitaxial layer 80 is formed on the surfaces of the side wall insulating layers 120, the well layer 44, the dielectric layer 28D and the channel layer 42. The source/drain epitaxial layer 80 includes the first epitaxial layer 85, the second epitaxial layer 86, the third epitaxial layer 87, and the fourth epitaxial layer 88. The epitaxial layer 80 functions as a stressor layer to provide appropriate stress to the channel layer 42 under the gate structure. In some embodiments, the second to fourth epitaxial layers apply tensile stress to the channel layer of the n-type Fin FET to enhance carrier mobility. In some embodiments, the second to fourth epitaxial layers apply compressive stress to the channel layer of the p-type Fin FET to enhance carrier mobility. The structures of the source/drain epitaxial layer 80 may be substantially the same as the embodiments shown in FIG. 24. The same materials, structures and/or configurations of FIG. 24 may be applied to FIG. 26, and the detailed explanation may be omitted.

After forming the Fin FET device as shown in FIG. 26, the gate structure as shown in FIGS. 17-19 are formed and one or more subsequent operations may be performed associated with the gate structure.

The various embodiments described herein offer several advantages over the existing art. For example, in the present disclosure, the source/drain epitaxial layer contains one or more epitaxial layers formed in a bottom-up profile, due to the formation and removal of the dielectric layer on the surfaces of the well layer and the channel layer. Thus, the one or more layers in the source/drain epitaxial layer can be formed without forming defects or voids. In addition, (111) planes of epitaxy profile of the source/drain epitaxial layer may be suppressed. The source/drain epitaxial layer with the channel on oxide structure may improve carrier mobility and suppress short channel effects, such as improving better drain induced barrier lowering (DIBL) control. In addition, a better strain and lower leakage of the Fin FET device can be provided. Furthermore, the dielectric layer is formed with one or more dopants instead of is formed or stated in one embodiment, to reduce channel resistivity and/or improve alternating current circuit speed of the Fin FET device.

It will be understood that not all advantages have been necessarily discussed herein, no particular advantage is required for all embodiments, and other embodiments may offer different advantages.

In accordance with one aspect of the present disclosure, a semiconductor device includes a fin field effect transistor (Fin FET) device. The Fin FET device includes a fin structure extending in a first direction and protruding from an isolation insulating layer. The fin structure and the isolation insulating layer are disposed over a substrate. The fin structure includes a well layer, an oxide layer disposed over the well layer and a channel layer disposed over the oxide layer. The Fin FET device further includes a gate structure covering a portion of the fin structure and extending in a second direction perpendicular to the first direction. The Fin FET device further includes a source and a drain. Each of the source and drain includes a stressor layer disposed in recessed portions formed in the fin structure. The stressor layer extends above the recessed portions and applies a stress to a channel layer of the fin structure under the gate structure. The Fin FET device further includes a dielectric layer formed in contact with the oxide layer and the stressor layer in the recessed portions.

In accordance with another aspect of the present disclosure, a method for manufacturing a semiconductor device includes the following steps. A fin structure including a well layer, an oxide layer disposed over the well layer and a channel layer disposed over the oxide layer is formed. An isolation insulating layer is formed so that the channel layer of the fin structure protrudes from the isolation insulating layer and at least a part of the oxide layer or an entirety of the oxide layer is embedded in the isolation insulating layer. A gate structure is formed over a part of the fin structure and over the isolation insulating layer. A recessed portion is formed by etching a part of the fin structure not covered by the gate structure such that the channel layer, the oxide layer and the well layer are exposed in the recessed portion. A dielectric layer is formed in the recessed portion. The dielectric layer comprises a first portion over the exposed well layer in the recessed portion and a second portion over the exposed channel layer in the recessed portion. The first portion of the dielectric layer is removed to expose the exposed well layer. A first epitaxial layer is formed over the exposed oxide layer and the exposed well layer in the recessed portion. The second portion of the dielectric layer is removed after forming the first epitaxial layer. The second epitaxial layer disposed on the first epitaxial layer in the recessed portion is formed.

In accordance with yet another aspect of the present disclosure, a method for manufacturing a semiconductor device includes the following steps. A fin structure including a well layer, an oxide layer disposed over the well layer and a channel layer disposed over the oxide layer is formed. An isolation insulating layer is formed so that the channel layer of the fin structure protrudes from the isolation insulating layer and at least a part of the oxide layer or an entirety of the oxide layer is embedded in the isolation insulating layer. A gate structure is formed over a part of the fin structure and over the isolation insulating layer. A recessed portion is formed by etching a part of the fin structure not covered by the gate structure such that the channel layer, the oxide layer and the well layer are exposed in the recessed portion. A dielectric layer is formed in the recessed portion. The dielectric layer comprises a first portion over the exposed well layer in the recessed portion, a second portion over the exposed oxide layer in the recessed portion, a third portion over the exposed channel layer in the recessed portion. The first portion of the dielectric layer is removed to expose the exposed well layer. A first epitaxial layer is formed over the exposed well layer and the second portion of the dielectric layer in the recessed portion. The third portion of the dielectric layer is removed after forming the first epitaxial layer. second epitaxial layer disposed on the first epitaxial layer in the recessed portion is formed.

What is claimed is:

1. A semiconductor device, comprising:
    a fin structure extending in a first direction disposed over a substrate, the fin structure including a well layer, an oxide layer disposed over the well layer and a channel layer disposed over the oxide layer;
    a gate structure covering a portion of the fin structure and extending in a second direction perpendicular to the first direction;
    a stressor layer applying a stress to the channel layer disposed in recessed portions formed in the fin structure; and
    a dielectric layer formed in contact with the oxide layer and the stressor layer in the recessed portions,
    wherein the dielectric layer is disposed between the oxide layer and the stressor layer along the first direction.

2. The semiconductor device of claim 1, wherein the oxide layer includes SiGe oxide or Ge oxide.

3. The semiconductor device of claim 1, wherein the dielectric layer includes silicon oxide, silicon nitride, silicon oxynitride, or silicon carbide.

4. The semiconductor device of claim 1, wherein a height of the stressor layer is substantially equal to or larger than a height of the oxide layer.

5. The method of claim 1, wherein a thickness of the dielectric layer is in a range of 1 nm to 10 nm.

6. The method of claim 1, wherein the stressor layer includes multiple stressor layers.

7. The semiconductor device of claim 1, wherein the stressor layer includes at least one of SiC, SiP, SiGe, and Ge.

8. The semiconductor device of claim 1, further comprising side wall insulating layers disposed over side walls of the gate structure.

9. The semiconductor device of claim 8, wherein the dielectric layer is further in contact with the side wall insulating layers.

10. A semiconductor device, comprising:
    a Fin FET device including:
    a fin structure extending in a first direction disposed over a substrate, the fin structure including a well layer, an oxide layer disposed over the well layer and a channel layer disposed over the oxide layer;
    a gate structure disposed over a portion of the fin structure and extending in a second direction perpendicular to the first direction;
    a recess formed in the fin structure;
    a first epitaxial layer disposed in the recess;
    a second epitaxial layer disposed over the first epitaxial layer in the recess; and
    a third epitaxial layer disposed over the second epitaxial layer in the recess,
    wherein the first, second, and third epitaxial layers have different compositions;
    a dielectric layer disposed between and in contact with the oxide layer and the first epitaxial layer in the recessed portion.

11. The semiconductor device of claim 10, wherein the oxide layer includes SiGe oxide or Ge oxide.

12. The semiconductor device of claim 10, wherein the dielectric layer includes silicon oxide, silicon nitride, silicon oxynitride, or silicon carbide.

13. The semiconductor device of claim 10, wherein a height of the first epitaxial layer is substantially equal to or larger than a height of the oxide layer.

14. The method of claim 10, wherein the second epitaxial layer includes multiple epitaxial layers.

15. The semiconductor device of claim 10, wherein the stressor layer includes at least one of SiC, SiP, SiGe, and Ge.

16. The semiconductor device of claim 10, wherein the dielectric layer is further disposed over the side wall insulating layers.

17. A method for manufacturing a semiconductor device, comprising:
    forming a fin structure including a well layer, an oxide layer disposed over the well layer and a channel layer disposed over the oxide layer extending in a first direction;

forming a gate structure over a part of the fin structure extending in a second direction perpendicular to the first direction;

forming a recess in a portion of the fin structure not covered by the gate structure such that the channel layer, the oxide layer and the well layer are exposed in the recess;

forming a dielectric layer over the exposed oxide layer in the recess;

forming a first epitaxial layer over the exposed well layer and the dielectric layer in the recessed portion, so that the dielectric layer is disposed between the oxide layer and the first epitaxial layer; and forming a second epitaxial layer over the first epitaxial layer in the recessed portion, wherein the first epitaxial layer and the second epitaxial layer are different.

18. The method according to claim 17, further comprising forming a third epitaxial layer over the second epitaxial layer in the recessed portion.

19. The method according to claim 18, further comprising forming a fourth epitaxial layer over the third epitaxial layer.

20. The method according to claim 17, further comprising forming side wall insulating layers over vertical main side walls of the gate structure, wherein the dielectric layer is formed over the side wall insulating layers.

\* \* \* \* \*